US012802943B2

(12) United States Patent
Pan

(10) Patent No.: US 12,802,943 B2
(45) Date of Patent: Nov. 17, 2026

(54) SYSTEM AND METHOD FOR RAPID GAS DELIVERY FOR ATOMIC LAYER ETCHING

(71) Applicant: Yang Pan, Singapore (SG)

(72) Inventor: Yang Pan, Singapore (SG)

(73) Assignee: Inspiring Atoms Pte Ltd, Singapore (SG)

( * ) Notice: Subject to any disclaimer, the term of this patent is extended or adjusted under 35 U.S.C. 154(b) by 226 days.

(21) Appl. No.: 18/740,634

(22) Filed: Jun. 12, 2024

(65) Prior Publication Data

US 2025/0385076 A1 Dec. 18, 2025

(51) Int. Cl.

| | |
|---|---|
| ***C23C 16/455*** | (2006.01) |
| ***H01J 37/32*** | (2006.01) |
| ***H01J 37/34*** | (2006.01) |

(52) U.S. Cl.

CPC .... *H01J 37/32449* (2013.01); *H01J 37/3467* (2013.01); *H01J 2237/3341* (2013.01)

(58) Field of Classification Search

CPC ............. H01J 37/32449; H01J 37/3467; H01J 2237/3341

See application file for complete search history.

(56) References Cited

U.S. PATENT DOCUMENTS

| | | | |
|---|---|---|---|
| 4,948,458 | A | 8/1990 | Ogle |
| 5,302,240 | A | 4/1994 | Hori et al. |
| 6,164,241 | A | 12/2000 | Chen et al. |
| 6,448,192 | B1 | 9/2002 | Kaushik |
| 7,416,989 | B1 | 8/2008 | Liu et al. |
| 8,227,344 | B2 | 7/2012 | Selsley et al. |
| 8,231,799 | B2 | 7/2012 | Bera et al. |
| 8,252,194 | B2 | 8/2012 | Kiehlbauch et al. |
| 8,264,154 | B2 | 9/2012 | Banner et al. |
| 8,808,561 | B2 | 8/2014 | Kanarik |
| 8,883,028 | B2 | 11/2014 | Kanarik |
| 9,130,158 | B1 | 9/2015 | Shen et al. |
| 9,257,638 | B2 | 2/2016 | Tan et al. |
| 9,362,131 | B2 | 6/2016 | Agarwal et al. |

(Continued)

FOREIGN PATENT DOCUMENTS

| | | | |
|---|---|---|---|
| TW | 201140687 | A1 | 11/2011 |
| TW | 1630656 | B | 7/2018 |

(Continued)

OTHER PUBLICATIONS

Coburn and Winters, "Ion-and electron-assisted gas-surface chemistry-an important effect in plasma etching", J. Appl. Phys. 50, 1979, pp. 3189-3196.

(Continued)

*Primary Examiner* — Yuechuan Yu

(57) ABSTRACT

Disclosed are systems and methods for expedited gas delivery in atomic layer etching (ALE) process systems. These systems utilize compact gas buffers positioned near the gas distribution unit, facilitating faster and more efficient gas introduction into the chamber. A controller manages the charging of gas buffers to contain the amount of gas required for a single ALE cycle. While one gas buffer discharges gas into the chamber for an ALE step, another buffer is concurrently charged. This configuration not only improves efficiency but also offers potential cost savings by eliminating components such as the manometer.

10 Claims, 5 Drawing Sheets

(56) References Cited

U.S. PATENT DOCUMENTS

Figure 1:
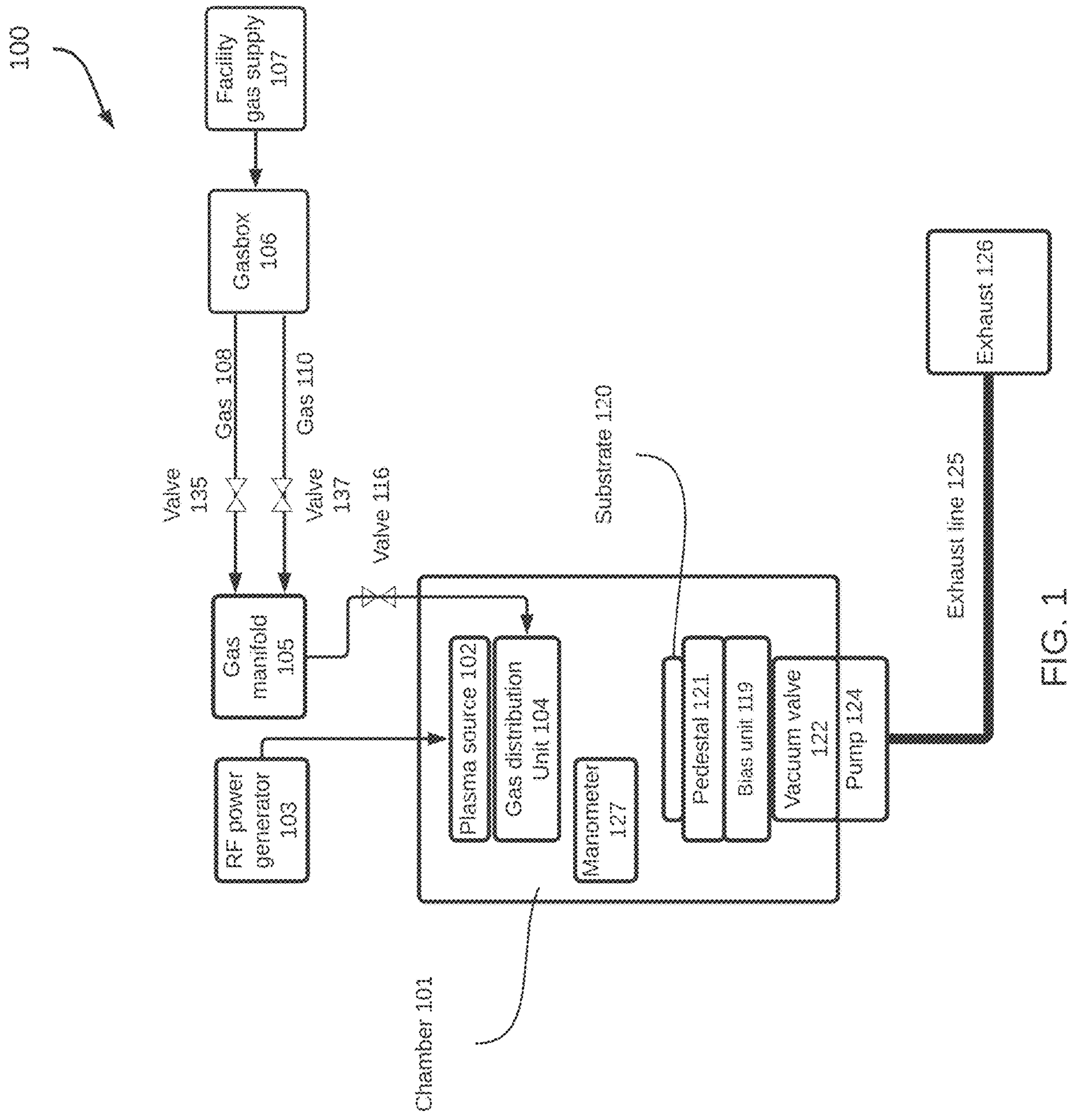

| | | | |
|---|---|---|---|
| 9,576,811 B2 | 2/2017 | Kanarik et al. | |
| 9,620,382 B2 | 4/2017 | Oehrlein et al. | |
| 9,713,200 B2 | 7/2017 | Pease | |
| 9,805,941 B2 | 10/2017 | Kanarik et al. | |
| 9,806,252 B2 | 10/2017 | Tan et al. | |
| 9,837,312 B1 | 12/2017 | Tan et al. | |
| 9,870,899 B2 | 1/2018 | Yang et al. | |
| 9,922,839 B2 | 3/2018 | Wise et al. | |
| 9,984,858 B2 | 5/2018 | Kanarik et al. | |
| 9,991,128 B2 | 6/2018 | Tan et al. | |
| 9,997,371 B1 | 6/2018 | Agarwal et al. | |
| 10,056,225 B2 | 8/2018 | Gaff et al. | |
| 10,056,264 B2 | 8/2018 | Yang et al. | |
| 10,096,487 B2 | 10/2018 | Yang et al. | |
| 10,121,639 B2 | 11/2018 | Kanarik et al. | |
| 10,208,383 B2 | 2/2019 | George et al. | |
| 10,269,566 B2 | 4/2019 | Tan et al. | |
| 10,304,659 B2 | 5/2019 | Kanarik et al. | |
| 10,374,144 B2 | 8/2019 | Tan et al. | |
| 10,494,715 B2 | 12/2019 | Agarwal et al. | |
| 10,559,461 B2 | 2/2020 | Reddy et al. | |
| 10,566,212 B2 | 2/2020 | Kanarik | |
| 10,566,213 B2 | 2/2020 | Kanarik et al. | |
| 10,685,836 B2 | 6/2020 | Tan et al. | |
| 10,727,073 B2 | 7/2020 | Tan et al. | |
| 10,749,103 B2 | 8/2020 | Tan et al. | |
| 10,763,083 B2 | 9/2020 | Yang et al. | |
| 10,825,659 B2 | 11/2020 | Treadwell et al. | |
| 11,450,513 B2 | 9/2022 | Yang et al. | |
| 2006/0243207 A1* | 11/2006 | Jursich | C23C 16/45512 427/248.1 |
| 2011/0139748 A1 | 6/2011 | Donnelly et al. | |
| 2015/0037972 A1 | 2/2015 | Danek et al. | |
| 2015/0270140 A1 | 9/2015 | Gupta et al. | |
| 2017/0316935 A1 | 11/2017 | Tan et al. | |
| 2018/0337046 A1 | 11/2018 | Shamma et al. | |
| 2020/0126758 A1 | 4/2020 | Leeser | |
| 2020/0258747 A1* | 8/2020 | Narushima | C09K 13/08 |
| 2020/0286743 A1 | 9/2020 | Lai et al. | |
| 2022/0199422 A1 | 6/2022 | Yang et al. | |
| 2022/0216050 A1 | 7/2022 | Yu et al. | |

FOREIGN PATENT DOCUMENTS

| | | |
|---|---|---|
| TW | 1757334 B | 3/2022 |
| WO | WO-2016/160778 A1 | 10/2016 |
| WO | WO-2022/046429 | 3/2022 |
| WO | WO-2023/183129 A1 | 9/2023 |

OTHER PUBLICATIONS

Gottscho et al., "Microscopic uniformity in plasma etching", J. Vac. Sci. Technol., B10, 1992, pp. 2133-2147.

Wang et al., "Experimental demonstration of multifrequency impedance matching for tailored voltage waveform plasma", J. Vac. Sci. Technol. A37, 2019, pp. 021303 1-11.

Karanik et al., "Overview of atomic layer etching in the semiconductor industry", J. Vac. Sci. Technol. A33, 2015, pp. 020802 1-14.

Lill, "Atomic layer processing", 2021, Wiley-VCH GmbH, Boschstr. 12, 69469 Weinheim, Germany.

Karanik et al., "Predicting synergy in atomic layer etching", J. Vac. Sci. Technol. A35, 2017, pp. 05C302 1-4.

Faraz et al., "Atomic Layer Etching: What Can We Learn from Atomic Layer Deposition?", ECS Journal of Solid Sate Science and Technology, 4(6), 2015, pp. N5023-N5032.

Karanik et al., "Atomic Layer Etching: Rethinking the Art of Etch", Journal of Physical Chemistry Letters, vol. 9, Aug. 10, 2018, pp. 4814-4821.

Karanik et al., "Universal scaling relatyionship for atomic layer etching", J. Vac. Sci. Technol. A39, 2021, pp. 010401-4.

Vella et al., "Molecular dynamics study of silicon atomic layer etching by chlorine and argon ions", J. Vac. Sci. Technol. B 40, 2022, pp. 023205-9.

Barish et al., "Sputtering of chlorinated silicon surfaces studied by secondary ion mass sepectrometry and ion scattering spectroscopy", J. Appl. Phys. 57, 1985, pp. 1336-1342.

Brichon et al., "MD simulation of low energy Clx+ ions interaction with ultra thin silicon layers for advanced etch processes", J. Vac. Sci. Technol. A32, 2014, pp. 021301-7.

Horiike et al., "Digital chemical vapor deposition and etching technologies for semiconductor processing", J. Vac. Sci. Technol. A8, 1990, pp. 1844-1850.

Donnelly, et al., "Plasma etching: Yesterday, today, and tomorrow", J. Vac. Sci. Technol. A31, 2013, pp. 050825-46.

Faraz et al., "Precise ion energy control with tailored waveform biasing for atomic scale processing", J. Appl. Phys. 128, 2020, pp. 213301-9.

Humbird et al., "Controlling surfaces in plasma processing: role of ions via molecular dynamics simulations of surface chemistry", Plasma Sources Sci. Technol. 11, 2002,A191-5.

Chang et al., "Kinetic study of low energy argon ion-enhanced plasma etching of polisilicon with atomic/molecular chlorine", J. Vac. Sci. Technol. A15, 1997, pp. 1853-1863.

Sho Kumakura et al., "A method for high selective etch of Si3N4 and SiC with ion modification and chemical removal", Jpn J. Appl. Phys. 58, 2019, pp. SEEB01-1-6.

Lee et al., "Ultrahigh selective etching of Si3N4 films over SiO2 films for silicon nitride gate spacer etching", J. Vac. Sci. Technol. B28, 2010, pp. 131-137.

Levinson et al., "Ion-assisted etching and profile development of silicon in molecular chlorine", J. Vac. Sci. Technol. A15, 1997, pp. 1902-1912.

Carver, "Atomic Layer Etching: An industry Pespective", ECS J. Solid State Sci. Technol. 4, 2015, pp. N5005-N5009.

Tan et al., "Highly Selective Directional Atomic Layer Etching of Silicon", ECS J. Solid State Sci. Technol. 4, 2015, N5010-N5012.

Yu et al., "Equivalent electric circuit model of accurate ion energy control with Tailored waveform biasing", J. Plasma Sources Sci. Technol. 31, 2022, pp. 035012 1-14.

* cited by examiner

SYSTEM AND METHOD FOR RAPID GAS DELIVERY FOR ATOMIC LAYER ETCHING

FIELD OF INVENTION

The present invention pertains to atomic layer etching (ALE) systems and methods. Specifically, it relates to an improved gas delivery mechanism designed to expedite the introduction of gases into a chamber of an ALE process system.

BACKGROUND

Reactive ion etching (RIE) is a predominant technology in semiconductor manufacturing. In RIE, various species, including neutrals, radicals, and ions, concurrently influence the etching process. A key characteristic of RIE is the synergistic interaction between ion and neutral fluxes, which significantly enhances the etching rate. This synergistic effect was first described by Coburn and Winters in "Ion- and electron-assisted gas-surface chemistry—an important effect in plasma etching," published in J. Appl. Phys., vol. 50, pages 3189-3196 (1979). They reported increased silicon etching rates when using an argon ion beam, a XeF2 neutral beam, and their combination. Effective RIE necessitates the presence of both ion and neutral fluxes to exploit this synergy. However, in modern etching processes, balancing these fluxes, particularly for etching high aspect ratio structures with dimensions shrinking to the nanometer scale, is increasingly complex. Achieving uniform results across 300 mm wafers and consistent repeatability in production pose additional challenges.

ALE has been developed to address the limitations of RIE. The ALE process system has evolved from the RIE process system, with less stringent requirements for achieving uniformity on a 300 mm wafer. However, ALE has unique requirements due to the nature of its process steps. An overview of ALE technology is presented by Karanik et al. in "Overview of atomic layer etching in the semiconductor industry" (J. Vac. Sci. Technol. A33, pages 020802 1-14, 2015), and further discussed by Lill in "Atomic layer processing: semiconductor dry etching technology" (Wiley-VCH GmbH, Boschstr. 12, 69469 Weinheim, Germany, 2021). ALE facilitates the controlled removal of material layers with atomic-level precision and is characterized as an etching technique using sequential self-limiting reactions. The basic ALE process includes two steps: surface modification and material removal. The modification creates a thin reactive layer with a defined thickness, which is easier to remove than the unmodified material. The removal step eliminates this modified layer while preserving the underlying substrate, thus resetting the surface for subsequent cycles. Material removal can be achieved using thermal energy by raising the wafer's temperature or kinetic energy from ions typically derived from inert gases. The isotropic process using thermal energy to remove modified layers is described in U.S. Pat. No. 10,208,383 to George et al. When utilizing energetic ions, the removal is conducted via a sputtering process. The anisotropic ALE process, as described in U.S. Pat. No. 10,727,073 to Tan et al., demonstrates the technology's versatility.

However, the introduction of gases into a chamber in a conventional ALE process system is slow and can impact process efficiency. Rapid delivery of gases is critical, especially when the etching process involves high-aspect-ratio structures which might necessitate numerous ALE cycles.

A charge volume design for faster precursor delivery systems is disclosed in a US Pat. Pub. 2020/0126758 by Leeser. The use of faster gas delivery system tailored for an ALE process system, however, has yet to be invented. There is a clear need for innovations in ALE process systems that streamline gas management, accelerate gas exchanges, reduce cycle time, and enhance the consistency of outcomes. It is in this context; the present inventive concept is embodied.

SUMMARY

The present invention introduces an ALE process system featuring a novel gas delivery system designed to expedite the gas introduction process into the ALE processing chamber. This system encompasses distinct gas buffers for different process gases, each buffer holding a volume of gas sufficient for one ALE cycle. Owing to the compact nature of these buffers, the gas stored within is maintained at a significantly higher pressure compared to the main process chamber. The swift influx of gas is further enhanced by placing these gas buffers close to the gas distribution unit.

In some embodiments, gas buffers are filled and emptied in a sequenced manner, controlled by pulse signals generated by a controller, ensuring a rapid and efficient introduction of gases into the chamber. This results in shorter ALE cycles, reduced chances of unintended RIE, and an overall improvement in process efficiency.

In some embodiments, the first gas buffer is filled with the first gas. The second gas buffer is filled with the second gas. The first gas is discharged into the chamber through a gas distribution unit during the surface modification step. The second gas is released into the chamber during the sputtering step. The second gas buffer is being filled while the first gas buffer is discharging and vise versa. The inventive concept allows very small gas buffers to be deployed to save valuable space atop the process chamber. The space above a process chamber is typically congested. The small size of the buffers also increases the gas pressure in the buffer and enables quicker delivery of the gases into the chamber.

In some other embodiments, valves are placed between the gas buffers and the gas distribution unit. Operations of the valves are controlled by pulse signal generated by the controller.

In some other embodiments, three-way valves are placed between a facility gas supply and a gas buffer through mass flow controllers (MFCs). The valves are controlled by pulse signals generated by the controller. If the valve is closed for a specific gas buffer, the gas from the facility gas supply will be redirect to a divert line. Atomic layer deposition (ALD) valves are preferred because of high speed of switching.

The gas quantity stored in a gas buffer is determined by two factors. The first factor is the flow rate of the MFC. Because MFC is a relatively slow device with a setting time around a few hundred milliseconds, MFC setting will remains as unchanged during an entire ALE process. Setting of MFC will be carried out before the ALE process is started. The second is duration that a gas buffer is connected to the facility gas supply.

In some embodiments, a gasbox could be eliminated which is a significant cost saving for the ALE system.

In some other embodiments, a manometer could also be eliminated.

The invention, therefore, provides a rapid and precise gas delivery system that is both efficient and cost-effective, paving the way for enhanced Atomic Layer Etching processes.

BRIEF DESCRIPTIONS OF DRAWINGS

The clarity of the embodiments is enhanced by referring to the following description in conjunction with the accompanying drawings:

FIG. 1: Illustrates a conventional ALE process system.

Figure 2:
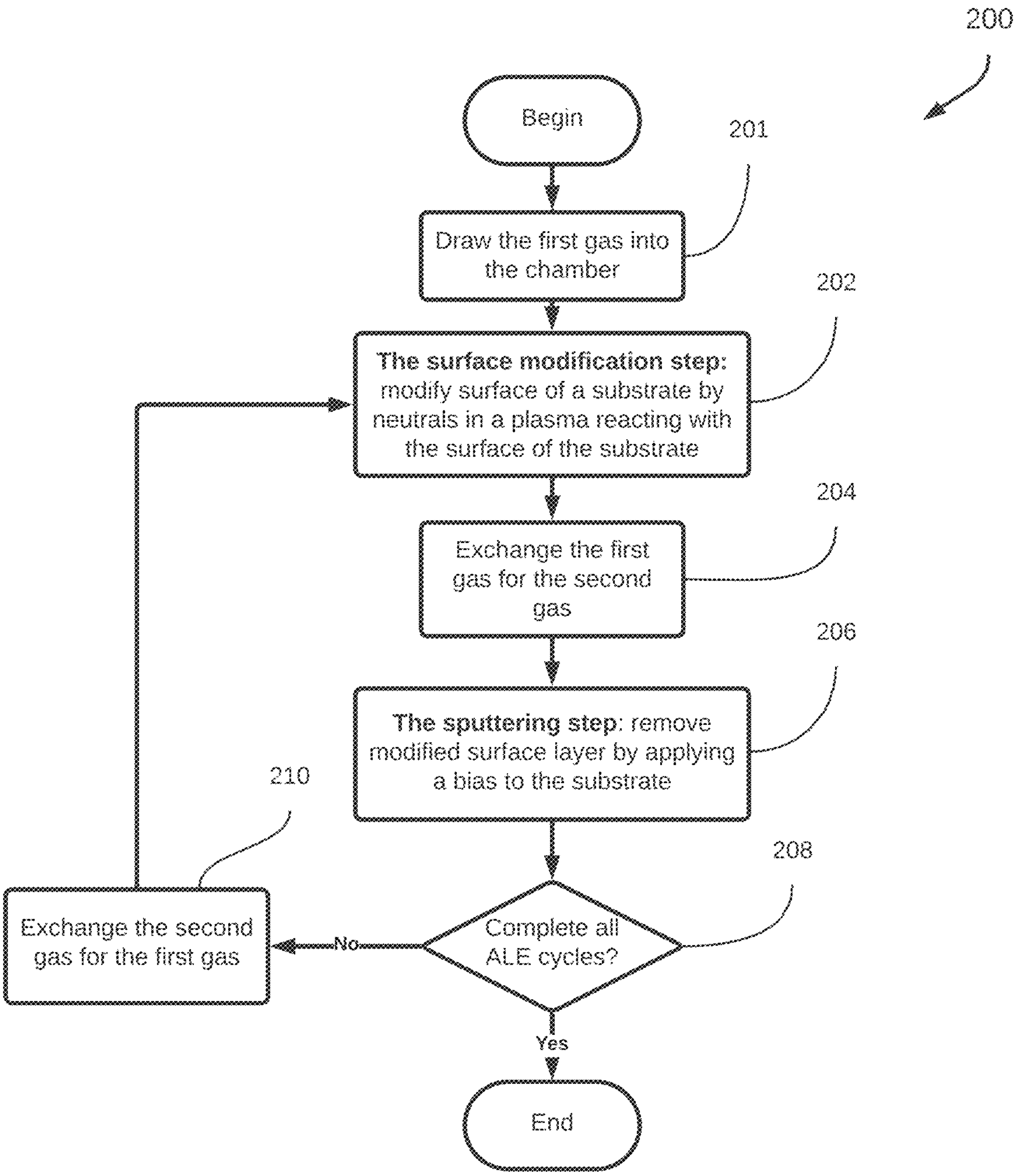

FIG. 2: Depicts a flowchart of the operations of the conventional ALE process system.

Figure 3B:
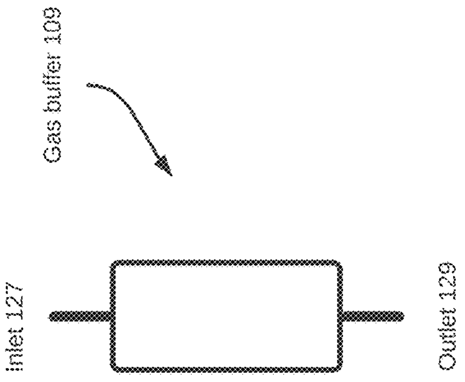
Figure 3A:
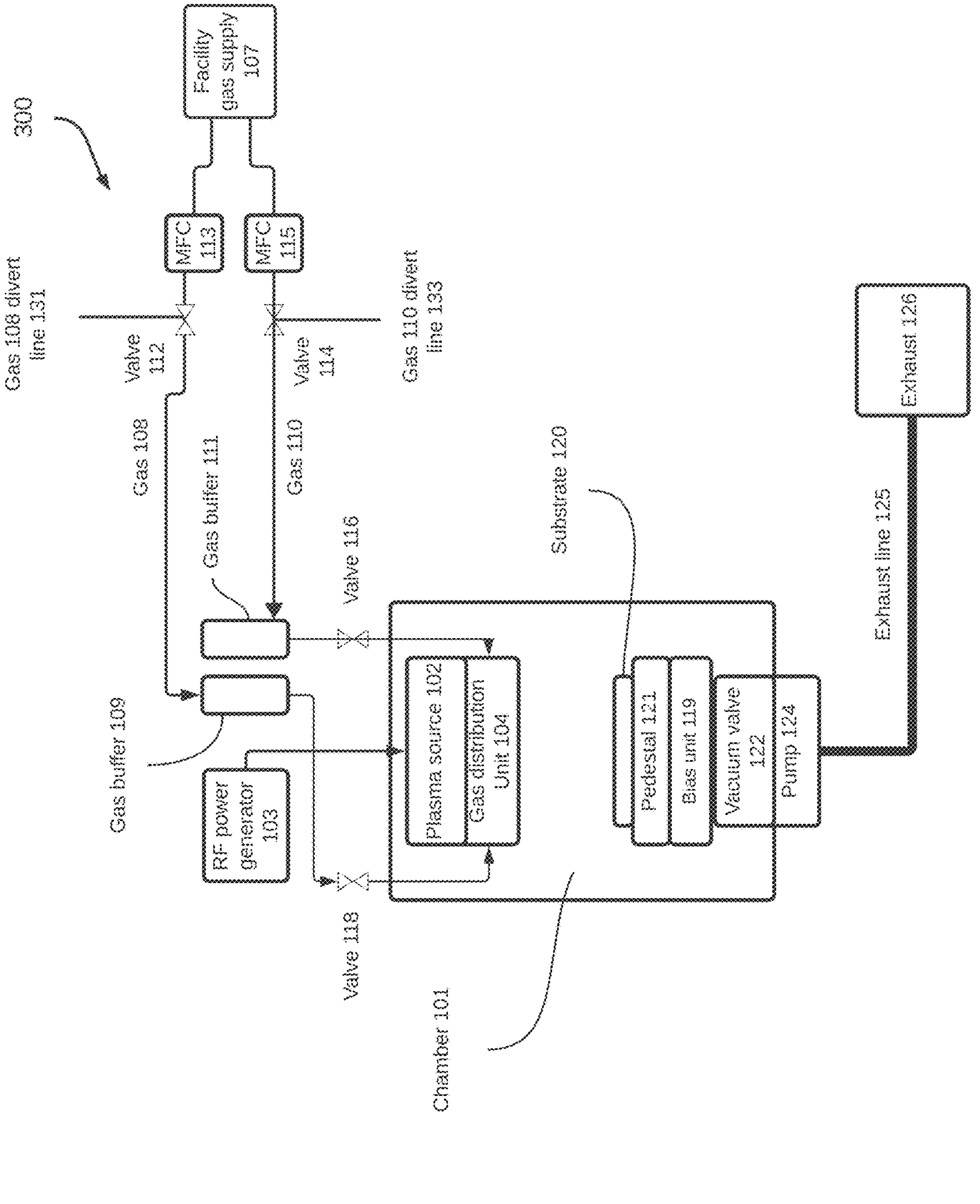

FIG. 3A: Demonstrates an ALE process system featuring with an embodiment of the gas delivery system.

FIG. 3B: Highlights a gas buffer design meant to expedite gas introduction into the chamber.

Figure 4:
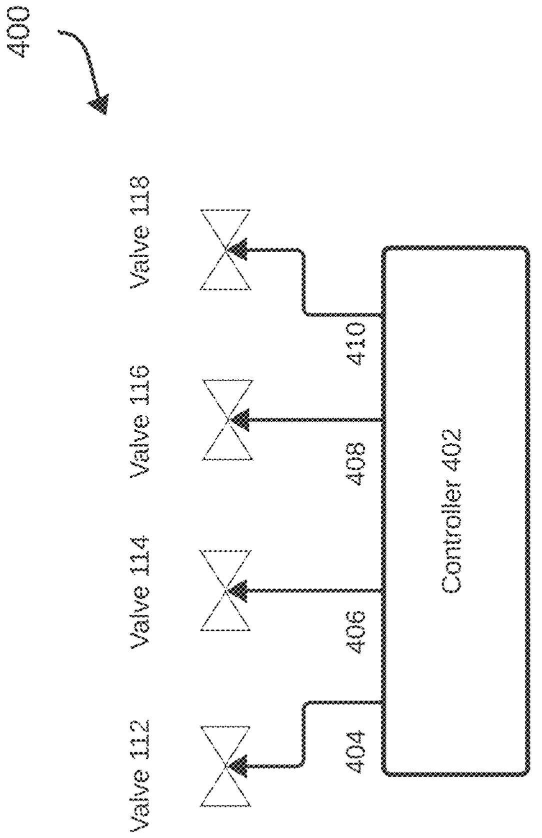

FIG. 4: Presents the functional operations of the gas delivery system.

Figure 5:
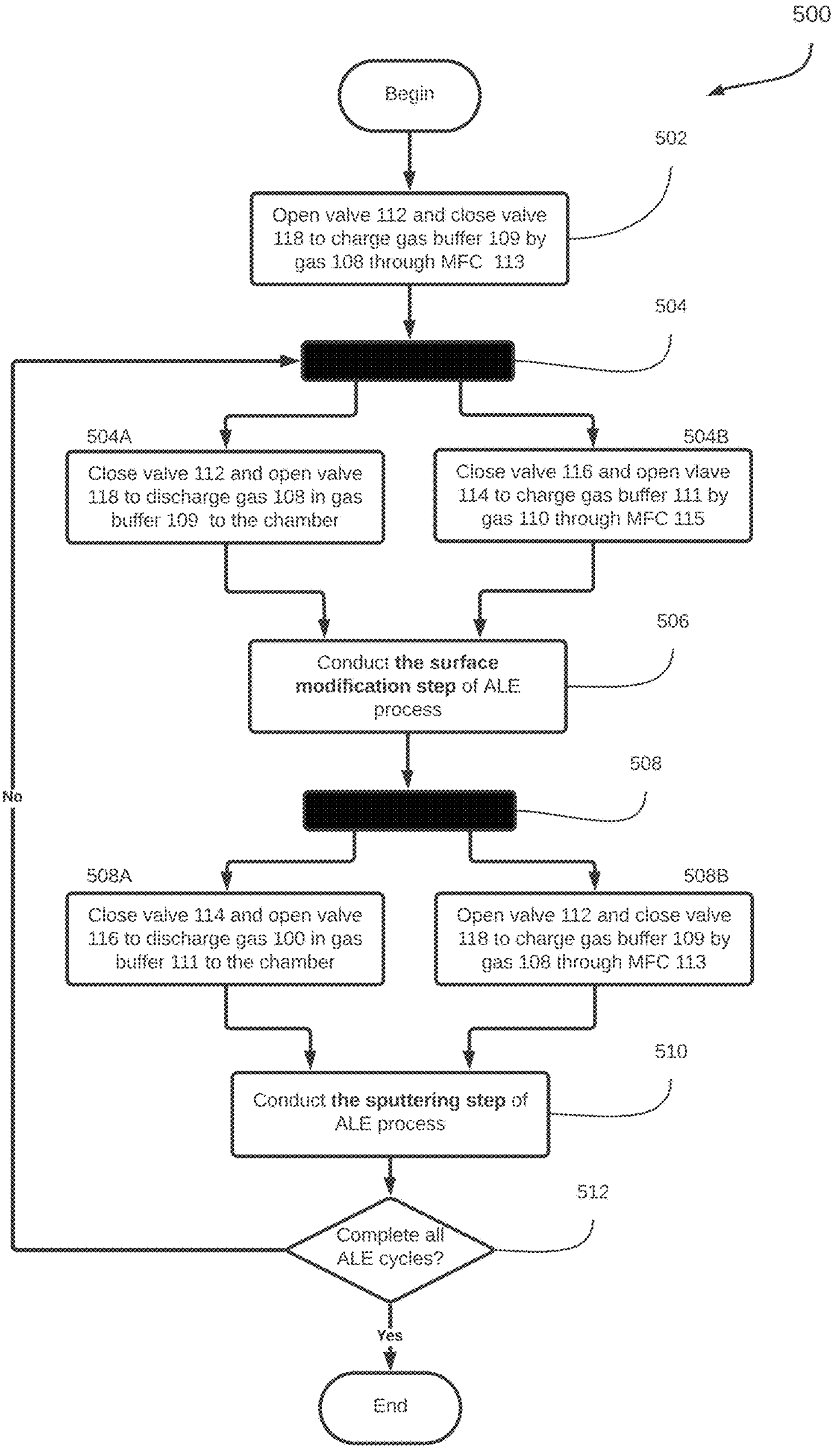

FIG. 5: Outlines the ALE process system's processing steps.

DETAILED DESCRIPTIONS

To foster a comprehensive understanding, this description elaborates on specific implementations of the current invention. While specific details are provided for elucidation, adjustments and variations that align with the following claims are deemed acceptable. Some established procedures and components are selectively detailed to underscore the unique facets of the invention.

FIG. 1 introduces a conventional ALE process system 100. Within a vacuumed environment lies a chamber 101 equipped with a plasma source 102 that's energized by an RF power generator 103. The plasma source 102 may be, but is not limited to, configurations like a transformer coupled plasma (TCP) or an inductively coupled plasma (ICP). In some designs, a matching network (not pictured) is placed between the RF power generator 103 and the plasma source 102. Alternatively, a direct connection might exist between the two.

In FIG. 1, a gas distribution unit 104 pulls gases from a gasbox 106 via a gas manifold 105. This unit 104 can be a showerhead or an injector, depending on the design. The manifold 105 blends gases prior to their introduction into the chamber 101. The gasbox 106 includes typically components like MFCs, gas pressure regulators, particle filters, gas mixers, and safety sensors. Two valves, 135 and 137, are placed between the gasbox 106 and the manifold 105 for gas 108 and 110, respectively. This two-line representation is merely exemplary; more than two gases might be involved in an ALE process. A valve 116 is installed between the manifold 105 and the gas distribution unit 104 to regulate gas inflow into the chamber 101. The gasbox 106 links to a facility gas supply 107.

Within the lower segment of chamber 101, a pedestal 121 supports a substrate 120 during processes. This pedestal 121 is often an electrostatic chuck (ESC) tailored for etching processes. To increase ion energy during etching, especially for high-aspect-ratio structures, a bias unit 119 is needed once the chamber's plasma is ignited. Depending on the design, this bias unit 119 can either be a RF power generator linked to the pedestal 121 via a blocking capacitor or a tailored waveform generator.

Gases, inclusive of reaction by-products, are removed from chamber 101 by a pump 124. A vacuum valve 122 above this pump modulates the gas extraction rate. The extracted gases then move to an exhaust 126 via an exhaust line 125. The chamber's steady-state pressure is the equilibrium result of both the injection rate and the extraction rate, with the process augmented by a proportional integral derivative (PID) control loop that utilizes chamber pressure readings from a manometer 127.

An ALE process operates cyclically, frequently involving two gases in two distinct steps: a surface modification step and a sputtering step. These two steps are also called two half cycles to complete one ALE cycle. FIG. 2 portrays this typical ALE process 200, which might involve more than two gases. In step 201, the first gas 108 is sourced from gasbox 106 to chamber 101 using the distribution unit 104. Step 202 indicates the chemical alteration of the substrate's surface during the surface modification step. For instance, chlorine gas can be introduced to create weaker silicon-chlorine bonds compared to native silicon bonds. Sometimes, plasma, created by the RF power generator 103 and plasma source 102, aids this alteration. In scenarios where plasma is utilized in the surface modification step, the pedestal bias is deactivated to prevent unwanted energetic ions that might degrade the ALE process. The ideal ALE process seeks mere surface modification without any etching in the modification step.

Upon concluding the surface modification step, the supply of the first gas 108 stops in step 204, and the second gas 110 is introduced. Depending on the design, there might be synchronization between the cessation of the first gas and the introduction of the second or a deliberate delay to ensure the first gas is thoroughly expelled from the chamber before the second gas's introduction. This delay ensures the prevention of undesirable RIE due to simultaneous gas presence. The second half-cycle of the ALE process mainly involves sputtering to eliminate the surface's atoms with weakened bonds. Since ions in the plasma produced by the plasma source 102 and the RF power generator 103 lack sufficient energy, a bias applied to the pedestal is essential to enhance ion energy, which is vital in the sputtering step of the ALE process.

Each ALE cycle only removes a few material layers. To achieve the targeted etch depth, at least several ALE cycles are necessary. Sometime ALE cycles could exceed one hundred if the structure created by ALE is a high aspect ratio structure. In step 208, the cycles are tallied against a preset process recipe. Once all cycles are completed, the ALE process concludes. If not, step 210 swaps the second gas for the first, initiating a fresh ALE cycle. Similar to the earlier step, a delay might be introduced between gas swaps to avoid unintended RIE.

FIG. 3A depicts an embodiment 300 of an ALE process system with an embodiment of the novel gas delivery system. Several salient differences between embodiment 300 and the conventional ALE process system 100, as illustrated in FIG. 1, are noteworthy. Specifically, gas buffer 109 is incorporated for process gas 108 and gas buffer 111 for process gas 110. Delving deeper, as portrayed in FIG. 3B, a gas buffer is essentially a compact container equipped with an inlet 127 and an outlet 129, designed to receive and discharge received gas. In the context of the ALE process, the gas buffer reserves a quantity of the process gas sufficient for one cycle of the ALE process. Since the container's volume is substantially smaller than the process chamber 101, the gas within the buffer maintains a significantly higher pressure. In some implementations, a manometer or a pressure sensor might be placed inside the gas buffer to provide a measurement of the gas pressure inside the gas buffer. A problem associated with this approach is that it increases size of the gas buffer and results in undesired complexity. For example, the sensors would need to be powered and to communicate with a controller. It is therefore preferred to have a simpler gas buffer in a very compact form.

A connection is established between gas buffer 109 and the gas distribution unit 104 via valve 118, and similarly, gas buffer 111 is connected through valve 116. Given the criticality of rapid valve response, the use of ALD valves is advocated.

Once valve 118 is activated, the pressurized gas from gas buffer 109 discharges rapidly into the gas distribution unit 104. This fast influx is further expedited by positioning gas buffers 109 and 111 near the gas distribution unit 104, thereby reducing gas delivery time to the process chamber considerably.

MFC 113 connects to gas buffer 109 via valve 112, while MFC 115 connects to gas buffer 111 via another valve 114. Given the exigencies of the process, fast ALD valves are preferred. When valve 112 deactivates, valve 118 comes into operation. Simultaneously, valve 116 remains inactive, and valve 114 takes over. With valve 114 operational, gas 110 channels from the facility gas supply 107 to gas buffer 111, controlled by MFC 115. The flow rate, as dictated by the MFC, determines the quantity of process gas 110 introduced into gas buffer 111. This quantity can be tweaked by modulating the charging time. Given that standard MFCs adjust their flow rates within a few hundred milliseconds, leveraging them for flow rate control in a rapid ALE process becomes unfeasible. In embodiment 300, MFCs consistently maintain an 'on' state, guaranteeing a steady flow rate for each process gas. In one implementation, valve 112 and valve 114 are three-way valves. Upon closing of valve 112 for the gas buffer 109, the gas 108 is redirected by the three-way valve 112 to a divert line 131. Similarly, the gas 110 is redirected to a divert line 133 after the valve 114 closes the gas buffer 111. The redirected gases may be sent to exhaust directly or be recycled.

MFCs 113 and 115 are coupled to a facility gas supply 107. Gas pressure regulators (not shown in the Figure) are typical used to bring the pressures of the gases to a desired value for MFCs. Some MFCs include the pressure regulators. In some implementations, particle filters may also be placed to reduce the particle counts. These components for the gas delivery are well known in the art and will not be discussed with great details.

FIG. 4 presents a functional diagram that delineates the operations of a gas delivery system 400. This Figure exemplifies a novel control design tailored for the ALE system 300.

Central to the scheme is a controller 402. This controller is employed to generate four pulse signals 404, 406, 408 and 410 to control valves 112, 114, 116 and 118, respectively. All the four pulse signals have the same period determined by the controller 402. In one implementation, pulse signal 410 for valve 118 may be an inversion of pulse signal 408 of valve 116. Pulse signal 406 for valve 114 may be an inversion of pulse signal 404 of valve 112. In another implementation, "on time" of the pulse signals may individually tuned to deliver the best process performance. For example, delays may be intentionally introduced to ensure that the gas is fully expelled from the chamber 101 before another gas is introduced. In some other implementations, a pulse may be introduced a few milliseconds ahead of its scheduled time to compensate for valve opening time. In one implementation, the pulse signals are square waveform with adjustable duty-cycles generated by the controller 402. In another implementation, the pulse signals are with a ramp-up and a ramp-down phases.

FIG. 5 illustrates the process flow 500 of ALE process system 300. In step 502, the pulse signal 404 prompts the opening of valve 112, and concurrently, the pulse signal 406 closes valve 118. Subsequently, gas 108 traverses through MFC 113, charging the gas buffer 109. The quantity of gas 108 in gas buffer 109 is contingent on the flow rate, which MFC 113 controls with its setting point, and the duration valve 112 remains open, governed by the on-time of pulse signal 404. Given the MFC 113's inherent latency—roughly several hundred milliseconds—it remains constantly activated. Prior to the actuation of valve 112, gas 108 is directed to the divert line 131.

Step 504 bifurcates into two concomitant processes: 504A and 504B. In 504A, pulse signal 404 closes valve 112, while pulse signal 410 opens valve 118. Gas 108 from the gas buffer 109 then is discharged into the chamber 101. Concurrently, in 504B, valve 114 is actuated open by pulse signal 406, and valve 116 is deactivated by pulse signal 408. As a result, gas buffer 111 fills with gas 110 through MFC 115. The quantity of the gas 110 in buffer 111 relies on the flow rate set by MFC 115 and the duration of the pulse signal 406. Post-closing of valve 114 to the gas buffer 111, gas 110 is rerouted to divert line 133 by the valve 114.

The surface modification step of the ALE process is executed in Step 506. Herein, gas 108 is ionized into plasma via the RF power generator 103, channeling energy to the plasma source 102. This results in the diffusion of chemically active neutrals to the substrate 120, leading to the alteration of one or multiple monolayers on the substrate surface, manifesting weakened chemical bonds. Notably, during this step, the bias 119 for pedestal 121 remains inactivated.

Step 508 further divides into two parallel actions: 508A and 508B. In 508A, pulse signal 406 triggers the closing of valve 114, while pulse signal 408 activates valve 116, releasing gas 110 from gas buffer 111 into process chamber 101. Simultaneously, in 508B, valve 112 is actuated by pulse signal 404, while pulse signal 410 deactivates valve 118. Consequently, with valve 112 being opened for the gas buffer 109, gas 108 courses through MFC 113, replenishing the gas buffer 109.

The subsequent sputtering step of the ALE process unfolds within process chamber 101. During this phase, RF power generator 103, when switched on, generates ions by transmitting RF power to the plasma source 102. Activating the pedestal bias unit 119 facilitates the generation of energetic ions, which are then directed to the substrate surface, removing the chemically altered surface layer formed during the ALE process's modification step. Step 512 sees completion of the ALE process and conclude the process 500. Otherwise, the cycle repeats.

The invention claimed is:

1. An ALE process system, comprising:

a process chamber designed for operation under vacuum conditions;

a pedestal located within said process chamber, designed to support a substrate during an ALE process;

a gas distribution unit for introducing process gases into the process chamber; and a gas delivery system comprising a first gas buffer, a second gas buffer, and a controller, wherein said first gas buffer stores a first gas intended for a surface modification step, while said second gas buffer stores a second gas intended for a sputtering step, wherein said second gas buffer is charged with the second gas from a facility gas supply while the first gas buffer releases the first gas into the process chamber through the gas distribution unit, the charging of the second gas buffer and the releasing of the first gas occurring under control of the controller, and said first gas buffer is charged with the first gas from a the facility gas supply while the second gas buffer releases the second gas into the process chamber through the gas distribution unit, the charging of the first gas buffer and the releasing of the second gas occurring under control of the controller.

2. The system of claim 1, wherein said first gas buffer is charged by with the first gas from the facility gas supply via a first mass flow controller (MFC) and said second gas buffer is charged with the second gas through a second MFC.

3. The system of claim 2, wherein the first MFC determines a quantity of the first gas in said first gas buffer, and the second MFC determines a quantity of the second gas in said second gas buffer.

4. The system of claim 3, wherein the quantity of the first gas is additionally determined by a duration during which said first gas buffer is connected to the facility gas supply, and the quantity of the second gas is additionally determined by a duration during which said second gas buffer is connected to the facility gas supply.

5. The system of claim 2, further including a three-way valve situated between the first MFC and said first gas buffer, wherein said valve directs the first gas to a divert line when said valve is closed to said first gas buffer, wherein said valve is controlled by a pulse signal from the controller.

6. The system of claim 2, further incorporating a three-way valve situated between the second MFC and said second gas buffer, wherein said valve directs the second gas to a divert line when said valve is closed to said second gas buffer, wherein said valve is controlled by a pulse signal from the controller.

7. The system of claim 1, further including a valve positioned between said first gas buffer and the gas distribution unit, controlled by a pulse signal from the controller.

8. The system of claim 1, further including a valve positioned between said second gas buffer and the gas distribution unit, controlled by a pulse signal from the controller.

9. The system of claim 1, wherein said system lacks a gasbox.

10. The system of claim 1, wherein said system lacks a manometer.

* * * * *